US008232822B2

(12) United States Patent
Tsai (10) Patent No.: US 8,232,822 B2
(45) Date of Patent: Jul. 31, 2012

(54) CHARGE PUMP AND PHASE-DETECTING APPARATUS, PHASE-LOCKED LOOP AND DELAY-LOCKED LOOP USING THE SAME

(75) Inventor: Meng-Ting Tsai, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 154 days.

(21) Appl. No.: 12/726,350

(22) Filed: Mar. 18, 2010

(65) Prior Publication Data

US 2011/0199136 A1 Aug. 18, 2011

(30) Foreign Application Priority Data

Feb. 12, 2010 (TW) .............................. 99104795 A (51) Int. Cl.
*H03L 7/06* (2006.01)
(52) U.S. Cl. ........................................ 327/157; 327/148
(58) Field of Classification Search .................. 327/148, 327/157
See application file for complete search history.

(56) References Cited

U.S. PATENT DOCUMENTS

| 5,508,660 | A | | 4/1996 | Gersbach et al. | |
|---|---|---|---|---|---|
| 5,677,648 | A | * | 10/1997 | Jones | 331/17 |
| 5,734,279 | A | | 3/1998 | Bereza | |
| 6,124,741 | A | | 9/2000 | Arcus | |
| 6,181,210 | B1 | | 1/2001 | Wakayama | |
| 6,255,872 | B1 | | 7/2001 | Harada et al. | |
| 6,278,332 | B1 | | 8/2001 | Nelson et al. | |
| 6,420,914 | B1 | | 7/2002 | Hasegawa | |
| 6,466,078 | B1 | | 10/2002 | Stiff | |
| 6,664,829 | B1 | | 12/2003 | Hughes | |
| 6,980,046 | B2 | * | 12/2005 | Soe | 327/536 |
| 7,365,593 | B1 | | 4/2008 | Swanson | |
| 7,420,870 | B2 | * | 9/2008 | Park et al. | 365/233.1 |
| 7,439,784 | B2 | * | 10/2008 | Lin | 327/157 |
| 7,545,223 | B2 | * | 6/2009 | Watanabe | 331/17 |
| 7,548,126 | B2 | * | 6/2009 | Hayashi | 331/57 |
| 2005/0068074 | A1 | * | 3/2005 | Yahagi et al. | 327/157 |
| 2005/0195003 | A1 | * | 9/2005 | Soe | 327/157 |
| 2007/0182452 | A1 | * | 8/2007 | Shibata et al. | 326/82 |
| 2009/0303094 | A1 | * | 12/2009 | Pun et al. | 341/144 |
| 2011/0074223 | A1 | * | 3/2011 | Siniscalchi et al. | 307/115 |
| 2011/0199136 | A1 | * | 8/2011 | Tsai | 327/157 |

OTHER PUBLICATIONS

W. Rhee, "Design of high-performance CMOS charge pumps in phase-locked loops," ISCAS, vol. 2, pp. 545-548, 1999.
Jae-Shin et al., "Charge pump with perfect current matching characteristics in phase-locked loops," Electronics Letters, vol. 36, No. 23, Nov. 9, 2000, pp. 1907-1908.

* cited by examiner

*Primary Examiner* — Lincoln Donovan
*Assistant Examiner* — Adam Houston
(74) *Attorney, Agent, or Firm* — Jianq Chyun IP Office (57) ABSTRACT

A charge pump including a first current source, a second current source, a first switch, a second switch, a third switch, a fourth switch, and a reset switch is provided. First terminals of the first and the third switch are coupled to the first current source. First terminals of the second and the fourth switch are coupled to the second current source. Second terminals of the first, the second, and the reset switch are coupled to an output terminal of the charge pump. A first terminal of the reset switch is coupled to the second terminals of the third and the fourth switch. Control terminals of the first, the second, the third, and the fourth switch respectively receive a first control signal, a second control signal, an inverted signal of the first control signal, and an inverted signal of the second control signal.

12 Claims, 10 Drawing Sheets

CHARGE PUMP AND PHASE-DETECTING APPARATUS, PHASE-LOCKED LOOP AND DELAY-LOCKED LOOP USING THE SAME

CROSS-REFERENCE TO RELATED APPLICATION

This application claims the priority benefit of Taiwan application serial no. 99104795, filed on Feb. 12, 2010. The entirety of the above-mentioned patent application is hereby incorporated by reference herein and made a part of specification.

BACKGROUND

1. Technical Field

The present disclosure relates to a charge pump.

2. Description of Related Art

System-on-chip (SoC) is a very promising technique in today's increasingly precise chip application field. However, a clean and stable clock generator is required in each chip for providing a system clock signal to the more and more complicated structure. Thus, phase-locked loops (PLL) or delay-locked loops (DLL) are broadly used as system clock generators for generating a low-jitter clock signal that is unaffected by the fabricating process. Among all PLL structures, charge pump PLL is the most commonly used PLL thanks to its simple implementation and ease of mass production. In a charge pump PLL or DLL circuit, the most important issue is about the design of the charge pump circuit because charge pump is a very important analog block in a circuit. Accordingly, the design of a charge pump circuit affects the performance of a PLL or DLL circuit greatly, and how to improve the efficiency, precision, and operation rate of a charge pump circuit has become a major subject in PLL design.

Figure 1:
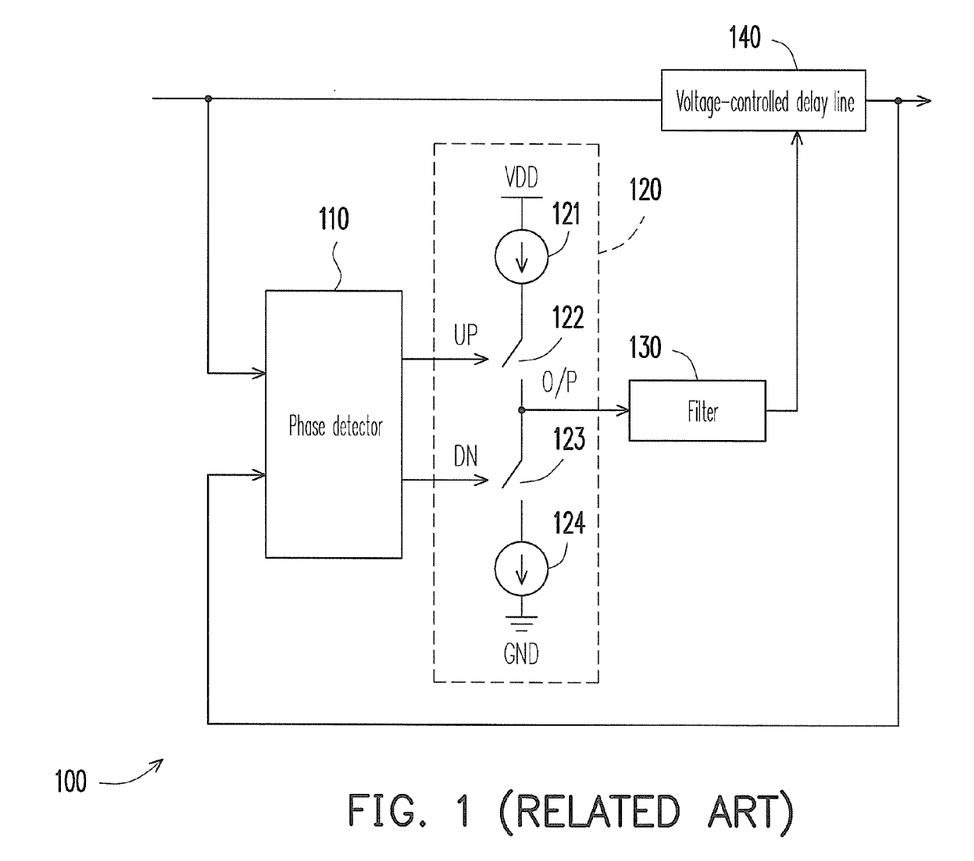
FIG. 1 is a function block diagram of a conventional charge pump applied in a delay-locked loop (DLL).
Figure 2:
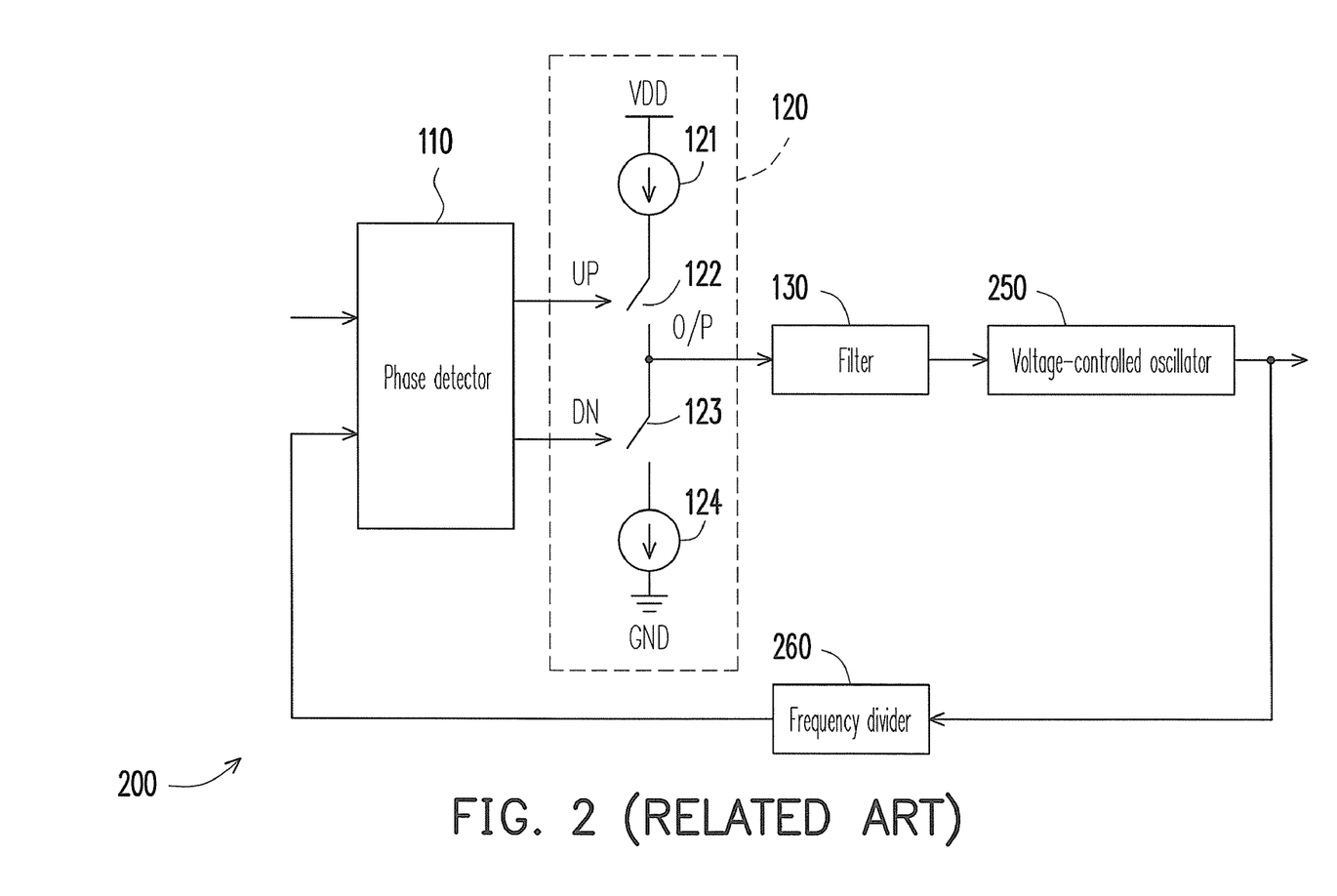
FIG. 2 is a function block diagram of a conventional charge pump applied in a phase-locked loop (PLL).

FIG. 1 is a function block diagram of a conventional charge pump applied in a DLL 100. The DLL 100 has a phase detector (PD) 110, a charge pump 120, a filter 130, and a voltage-controlled delay line (VCDL) 140. FIG. 2 is a function block diagram of a conventional charge pump applied in a PLL 200. The PLL 200 has a PD 110, a charge pump 120, a filter 130, a voltage-controlled oscillator (VCO) 250, and a frequency divider 260. Implementations of the DLL 100 and the PLL 200 are well known by those having ordinary knowledge in the art therefore will not be described herein.

Figure 3:
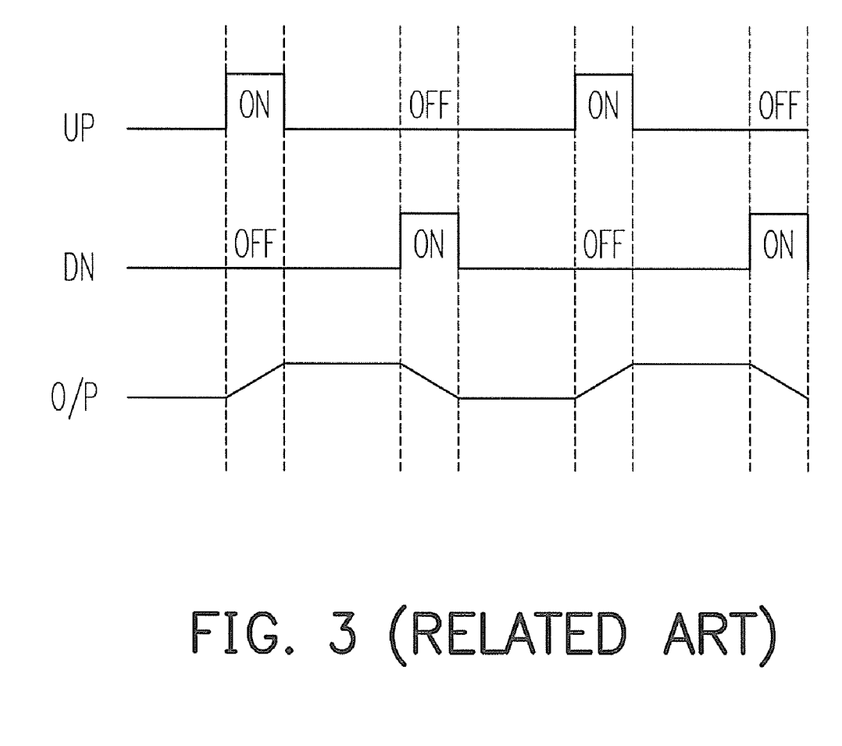
FIG. 3 is a timing diagram of signals in a conventional charge pump.

The charge pump 120 is a very common circuit block in the DLL 100 or the PLL 200. FIG. 3 is a timing diagram of signals in a conventional charge pump. The charge pump 120 charges or discharges the capacitive load of the filter 130 by using digital control signals UP and DN and converts the digital control signals UP and DN into an analog voltage O/P, so as to control the clock delay of the VCDL 140 (or the output frequency of the VCO 250). Thereby, a desired system clock signal is provided. However, when the switch 122 is turned off according to the control signal UP or the switch 123 is turned off according to the control signal DN, the problem of floating node may be caused between the switch 122 and the current source 121 or between the switch 123 and the current source 124. For example, if the switch 122 is turned off at this time, the node between the switch 122 and the current source 121 is floated because of the high impedance of the current source 121. As a result, the node between the switch 122 and the current source 121 may be affected by noises, and the problem of charge sharing may be produced.

SUMMARY

Accordingly, the embodiments of the present disclosure is directed to a charge pump, and a phase-detecting apparatus, a phase-locked loop (PLL) and a delay-locked loop (DLL) using the charge pump, wherein the problems of floating node and charge sharing in the charge pump are resolved.

According to an exemplary embodiment of the present disclosure, a charge pump is provided, wherein an output signal is provided according to a first control signal and a second control signal. The charge pump includes a first current source, a second current source, a first switch, a second switch, a third switch, a fourth switch, and a reset switch. A control terminal of the first switch receives the first control signal, a first terminal of the first switch is coupled to the first current source, and a second terminal of the first switch is coupled to an output terminal of the charge pump. A control terminal of the second switch receives the second control signal, a first terminal of the second switch is coupled to the second current source, and a second terminal of the second switch is coupled to the output terminal of the charge pump. A control terminal of the third switch receives an inverted signal of the first control signal, and a first terminal of the third switch is coupled to the first current source. A control terminal of the fourth switch receives an inverted signal of the second control signal, a first terminal of the fourth switch is coupled to the second current source, and a second terminal of the fourth switch is coupled to a second terminal of the third switch. A first terminal of the reset switch is coupled to the second terminal of the third switch, and a second terminal of the reset switch is coupled to the output terminal of the charge pump.

According to an exemplary embodiment of the present disclosure, a phase-detecting apparatus including a phase detector (PD) and a charge pump is provided. The PD detects the phase relation between a first frequency signal and a second frequency signal and outputs a first control signal and a second control signal according to the phase relation so as to control the output of the charge pump. The charge pump includes a first current source, a second current source, a first switch, a second switch, a third switch, a fourth switch, and a reset switch. A control terminal of the first switch receives the first control signal, a first terminal of the first switch is coupled to the first current source, and a second terminal of the first switch is coupled to an output terminal of the charge pump. A control terminal of the second switch receives the second control signal, a first terminal of the second switch is coupled to the second current source, and a second terminal of the second switch is coupled to the output terminal of the charge pump. A control terminal of the third switch receives an inverted signal of the first control signal, and a first terminal of the third switch is coupled to the first current source. A control terminal of the fourth switch receives an inverted signal of the second control signal, a first terminal of the fourth switch is coupled to the second current source, and a second terminal of the fourth switch is coupled to a second terminal of the third switch. A first terminal of the reset switch is coupled to the second terminal of the third switch, and a second terminal of the reset switch is coupled to the output terminal of the charge pump.

According to an exemplary embodiment of the present disclosure, a PLL including a PD, a charge pump, a filter, a voltage-controlled oscillator (VCO), and a frequency divider is provided. The PD detects the phase relation between a first frequency signal and a second frequency signal and outputs a first control signal and a second control signal according to the phase relation, so as to control the output of the charge pump. An input terminal of the filter is coupled to an output terminal of the charge pump. An input terminal of the VCO is coupled to an output terminal of the filter. An input terminal of the frequency divider is coupled to an output terminal of the VCO, and an output terminal of the frequency divider provides the second frequency signal to the PD.

According to an exemplary embodiment of the present disclosure, a DLL including a PD, a charge pump, a filter, and a voltage-controlled delay line (VCDL) is provided. The PD detects the phase relation between a first frequency signal and a second frequency signal and outputs a first control signal and a second control signal according to the phase relation, so as to control the output of the charge pump. A control terminal of the VCDL is coupled to an output terminal of the filter, an input terminal of the VCDL receives the first frequency signal, and an output terminal of the VCDL provides the second frequency signal to the PD.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 4:
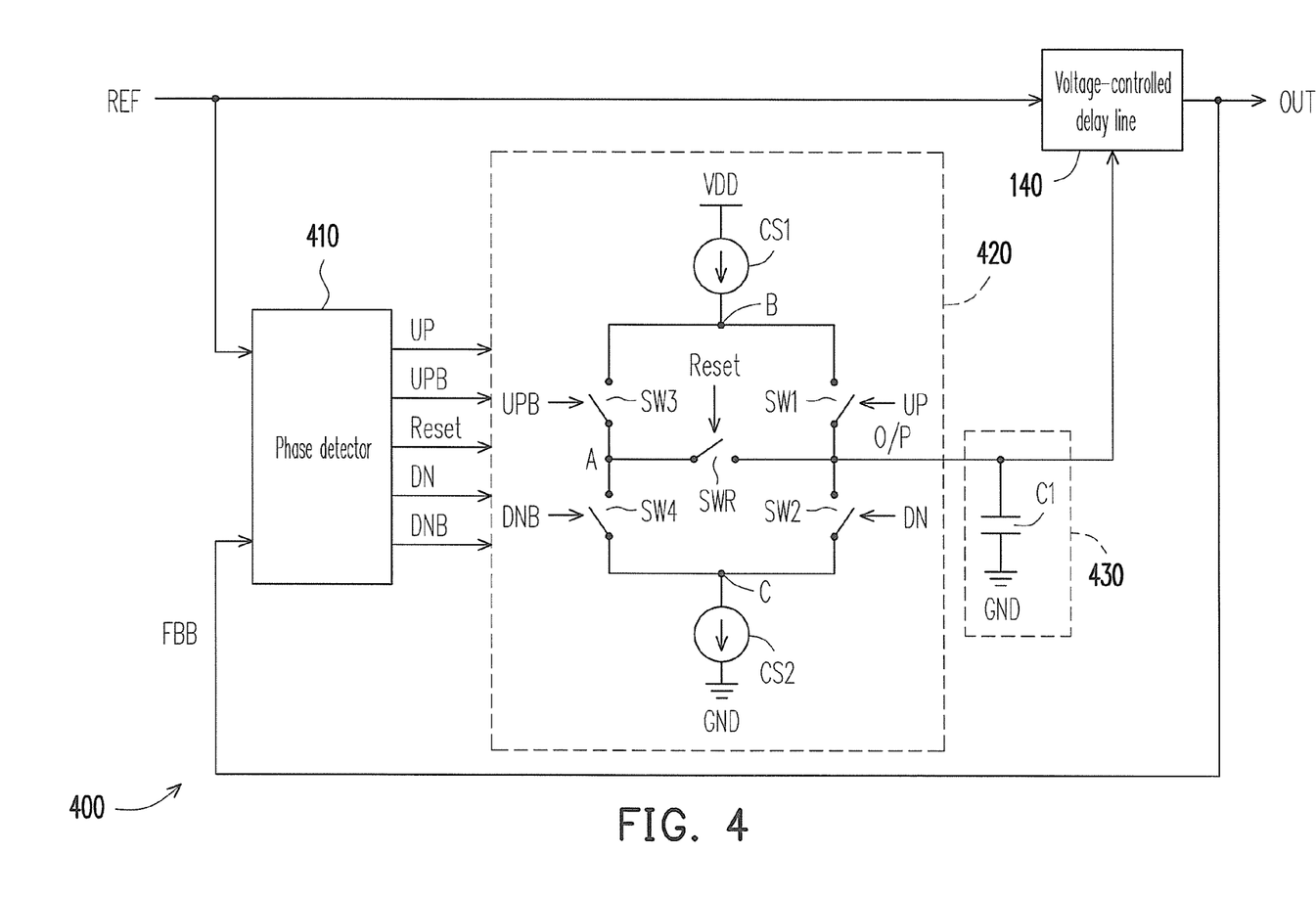
FIG. 4 is a function block diagram of a charge pump applied in a DLL according to an embodiment of the present disclosure.

FIG. 4 is a function block diagram of a charge pump applied in a delay-locked loop (DLL) 400 according to an embodiment of the present disclosure. The DLL 400 has a phase-detecting apparatus, a filter 430, and a voltage-controlled delay line (VCDL) 140. The phase-detecting apparatus includes a phase detector (PD) 410 and a charge pump 420. The PD 410 detects the phase relation between a first frequency signal REF and a second frequency signal FBB and outputs a first control signal UP and a second control signal DN according to the phase relation. The charge pump 420 includes a first current source CS1, a second current source CS2, a first switch SW1, a second switch SW2, a third switch SW3, a fourth switch SW4, and a reset switch SWR. A control terminal of the first switch SW1 receives the first control signal UP. A first terminal of the first switch SW1 is coupled to the first current source CS1, and a second terminal of the first switch SW1 is coupled to an output terminal of the charge pump 420. A control terminal of the second switch SW2 receives the second control signal DN. A first terminal of the second switch SW2 is coupled to the second current source CS2, and a second terminal of the second switch SW2 is coupled to the output terminal of the charge pump 420.

A control terminal of the third switch SW3 receives an inverted signal UPB of the first control signal UP, a first terminal of the third switch SW3 is coupled to the first current source CS1, and a second terminal of the third switch SW3 is coupled to a node A. A control terminal of the fourth switch SW4 receives an inverted signal DNB of the second control signal DN, a first terminal of the fourth switch SW4 is coupled to the second current source CS2, and a second terminal of the fourth switch SW4 is coupled to the second terminal of the third switch SW3. The inverted signals UPB and DNB may be provided by the PD 410. In some embodiments, if the PD (for example, the PD 110) does not provide the inverted signals UPB and DNB, an inverter may be disposed in the charge pump 420 for inverting the control signals UP and DN into the inverted signals UPB and DNB.

A first terminal of the reset switch SWR is coupled to the second terminal of the third switch SW3 (i.e., the node A), and a second terminal of the reset switch SWR is coupled to the output terminal of the charge pump 420 (i.e., O/P). The first switch SW1, the second switch SW2, and the reset switch SWR are turned on during a reset period Tr, wherein the reset period Tr may be defined according to a reset signal Reset in the PD 410. In some embodiments, if the PD (for example, the PD 110) does not provide the reset signal Reset, a logic circuit may be disposed in the charge pump 420 for detecting the falling edge of the control signal UP or DN and defining the reset period Tr according to the falling edge of the control signal UP or DN.

An input terminal of the filter 430 is coupled to the output terminal of the charge pump 420, and an output terminal of the filter 430 is coupled to a control terminal of the VCDL 140. The filter 430 may be any filter with capacitive load. In the present embodiment, the filter 430 includes a capacitor C1. A first terminal of the capacitor C1 is coupled to the output terminal of the charge pump 420 and the control terminal of the VCDL 140, and a second terminal of the capacitor C1 is coupled to a reference voltage (for example, a ground voltage).

The input terminal of the VCDL 140 receives the first frequency signal REF. The analog voltage O/P output by the charge pump 420 controls the delay time of the VCDL 140 through the filter 430. Thus, the VCDL 140 delays the first frequency signal REF so as to provide a corresponding output frequency signal OUT to a next-level circuit (not shown) through the output terminal thereof, wherein the output frequency signal OUT is sent back to the PD 410 as the second frequency signal FBB. The implementation of the VCDL 140 is well known by those having ordinary knowledge in the art therefore will not be described herein.

Figure 5:
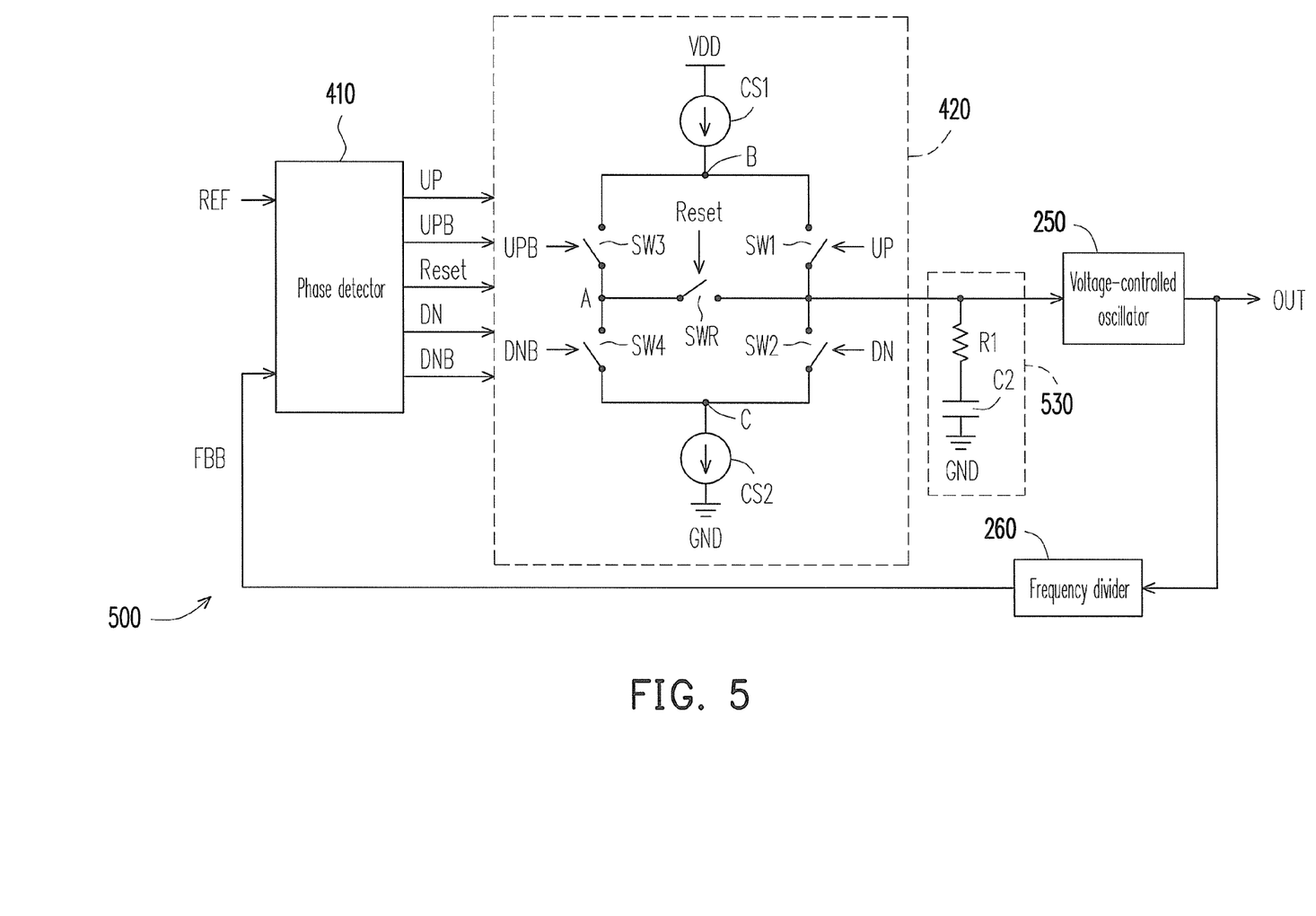
FIG. 5 is a function block diagram of a charge pump applied in a PLL according to an embodiment of the present disclosure.

FIG. 5 is a function block diagram of a charge pump applied in a phase-locked loop (PLL) 500 according to an embodiment of the present disclosure. The PLL 500 has a phase-detecting apparatus, a filter 530, a voltage-controlled oscillator (VCO) 250, and a frequency divider 260. The phase-detecting apparatus includes a PD 410 and a charge pump 420. The techniques about the PD 410 and the charge pump 420 can be referred to the description of FIG. 4 therefore will not be described herein. An input terminal of the filter 530 is coupled to an output terminal of the charge pump 420, and an output terminal of the filter 530 is coupled to an input terminal of the VCO 250. The filter 530 includes a resistor R1 and a capacitor C2. A first terminal of the resistor R1 is coupled to the output terminal of the charge pump 420 and the input terminal of the VCO 250. A first terminal of the capacitor C2 is coupled to a second terminal of the resistor R1, and a second terminal of the capacitor C2 is coupled to a reference voltage (for example, a ground voltage).

A control terminal of the VCO 250 receives an analog voltage O/P output by the charge pump 420 through the filter 530. The analog voltage O/P controls the oscillation frequency of the VCO 250. Thus, an output terminal of the VCO 250 provides a corresponding output frequency signal OUT to a next-level circuit (not shown). An input terminal of the frequency divider 260 is coupled to the output terminal of the VCO 250. The frequency divider 260 divides the frequency of the output frequency signal OUT and provides a corresponding second frequency signal FBB to the PD 410 through an output terminal thereof. The implementations of the VCO 250 and the frequency divider 260 are well known by those having ordinary knowledge in the art therefore will not be described herein.

Figure 6:
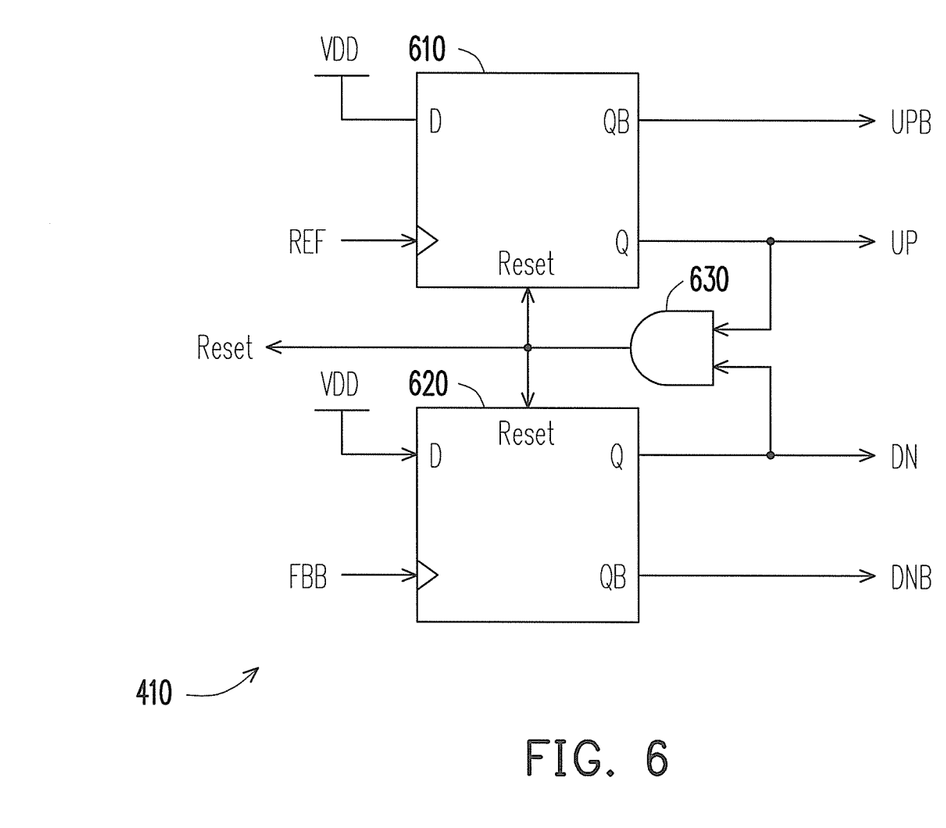
FIG. 6 is a function block diagram of a phase detector (PD) 410 in FIG. 4 or FIG. 5 according to an embodiment of the present disclosure.

FIG. 6 is a function block diagram of the PD 410 in FIG. 4 or FIG. 5 according to the present embodiment. The PD 410 includes a first flip-flop 610, a second flip-flop 620, and an AND gate 630. An input terminal D of the first flip-flop 610 receives a first voltage (for example, a system voltage VDD), a trigger terminal of the first flip-flop 610 receives a first frequency signal REF, an inverting output terminal QB of the first flip-flop 610 outputs an inverted signal UPB, and a non-inverting output terminal Q of the first flip-flop 610 outputs a first control signal UP. An input terminal D of the second flip-flop 620 receives the first voltage, a trigger terminal of the second flip-flop 620 receives the second frequency signal FBB, an inverting output terminal QB of the second flip-flop 620 outputs an inverted signal DNB, and a non-inverting output terminal Q of the second flip-flop 620 outputs a second control signal DN. A first input terminal and a second input terminal of the AND gate 630 are respectively coupled to the non-inverting output terminals Q of the first flip-flop 610 and the second flip-flop 620, and an output terminal of the AND gate 630 outputs a reset signal Reset to a control terminal of a reset switch SWR and reset terminals of the first flip-flop 610 and the second flip-flop 620.

Figure 7A:
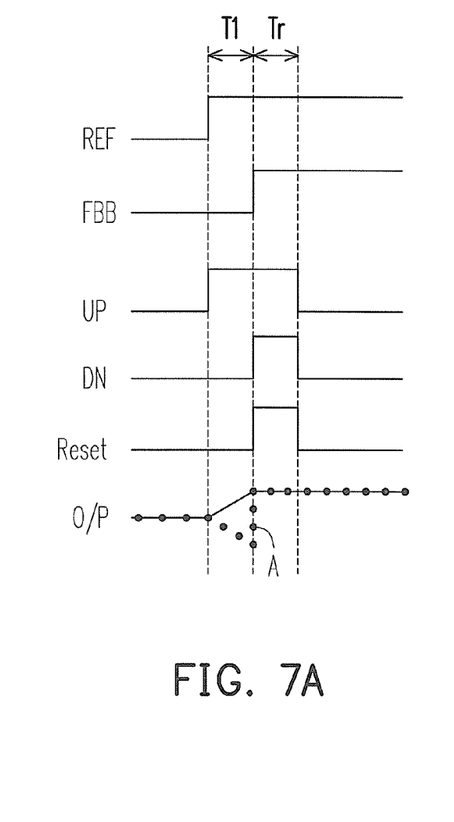
FIGS. 7A-7C are timing diagrams of signals in the PD 410 in FIG. 6 and the charge pumps 420 in FIG. 4 and FIG. 5.
Figure 7B:
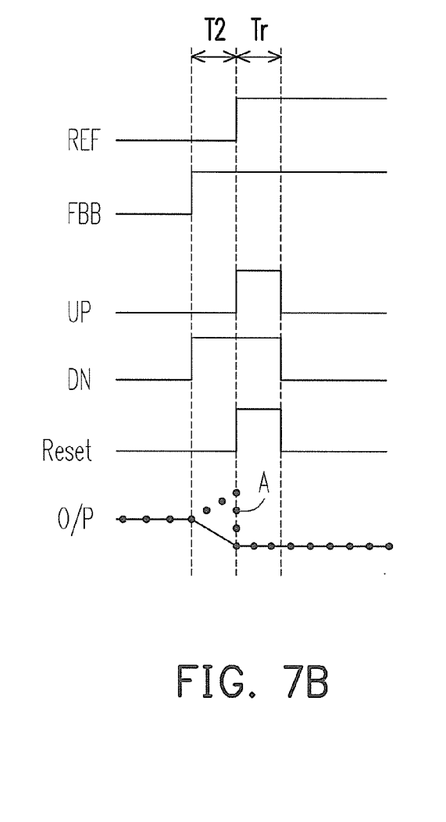
Figure 7C:
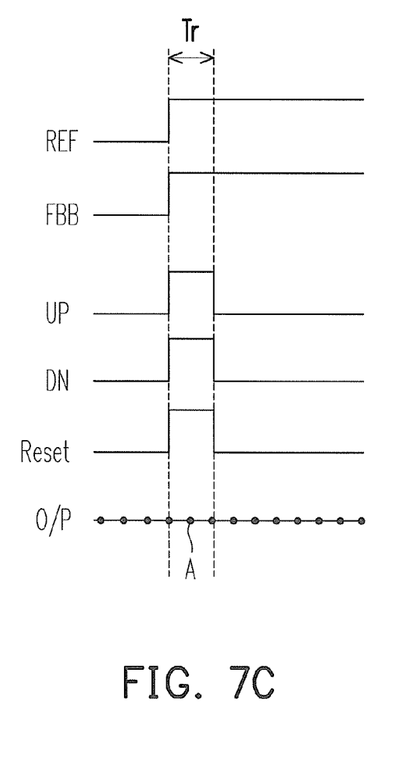

FIGS. 7A-7C are timing diagrams of signals in the PD 410 in FIG. 6 and the charge pumps 420 in FIG. 4 and FIG. 5. The first flip-flop 610 and the second flip-flop 620 are respectively triggered at the rising edges of the first frequency signal REF and the second frequency signal FBB. Once triggered, the first flip-flop 610 and the second flip-flop 620 respectively output the control signals UP and DN. When the first flip-flop 610 and the second flip-flop 620 are both triggered, the AND gate 630 outputs the reset signal Reset to reset the control signals UP and DN to a logic low level. As shown in FIGS. 7A-7C, the PD 410 detects the falling edge of the control signal UP or DN and defines a reset period Tr according to the falling edge of the control signal UP or DN. During the reset period Tr, the first switch SW1, the second switch SW2, and the reset switch SWR are turned on and the third switch SW3 and the fourth switch SW4 are turned off, so that the levels of the node A, the node B, and the node C are all reset to the level of the analog voltage O/P. The node C remains at the reset level through parasitic capacitance. Thus, when the reset period Tr is over, the first switch SW1, the second switch SW2, and the reset switch SWR are all turned off, and the node A, the node B, and the node C are electrically connected with each other to remain at the reset level (i.e., the level of the analog voltage O/P). Thereby, in the present embodiment, a floating status between the node B and the node C and the problem of charge sharing are avoided.

When the first frequency signal REF precedes the second frequency signal FBB, during the period T1 in FIG. 7A, the first switch SW1 and the fourth switch SW4 are turned on and the second switch SW2, the third switch SW3, and the reset switch SWR are turned off under the control of the first control signal UP, the second control signal DN, and the reset signal Reset. In this case, the first current source CS1 provides a charging current such that the analog voltage O/P increases correspondingly, as shown in FIG. 7A. During the period T1, the second current source CS2 provides a discharging current such that the voltage level on the node A decreases correspondingly. The reset period Tr is entered when a rising edge of the following second frequency signal FBB appears. As described above, the voltage levels on the node A, the node B, and the node C are all reset to the current level of the analog voltage O/P during the reset period Tr. By charging or discharging the capacitive load of the filter 430 or 530, the charge pump 420 can convert the digital control signals UP and DN into the analog voltage O/P so as to control the clock delay of the VCDL 140 (or the output frequency of the VCO 250).

When the first frequency signal REF falls behind the second frequency signal FBB, during the period T2 in FIG. 7B, the second switch SW2 and the third switch SW3 are turned on and the first switch SW1, the fourth switch SW4, and the reset switch SWR are turned off under the control of the first control signal UP, the second control signal DN, and the reset signal Reset. In this case, the second current source CS2 provides a discharging current such that the analog voltage O/P decreases correspondingly, as shown in FIG. 7B. During the period T2, the first current source CS1 provides a charging current such that the voltage level on the node A increases correspondingly. The reset period Tr is entered when a rising edge of the following first frequency signal REF appears, so that the voltage levels on the node A, the node B, and the node C are all reset to the current level of the analog voltage OT.

When the DLL 400 (or the PLL 500) is in a locked state (i.e., the phases of the first frequency signal REF and the second frequency signal FBB are about the same), referring to FIG. 7C, the PD 410 defines a reset period Tr at the falling edges of the control signals UP and DN. During the reset period Tr, the first switch SW1, the second switch SW2, and the reset switch SWR are turned on, and the voltage levels on the node A, the node B, and the node C are all refreshed to the level of the analog voltage O/P again.

Namely, the PD 410 outputs the control signals UP and DN according to two input clock signals so as to control the charge pump 420 to charge or discharge the capacitive load. When a reference frequency (the first frequency signal REF) precedes a feedback signal (the second frequency signal FBB), the PD 410 outputs the control signal UP so as to allow the VCO 250 to increase its output frequency (or the VCDL 140 to shorten its clock delay). Similarly, when the reference frequency (the first frequency signal REF) falls behind the feedback signal (the second frequency signal FBB), the PD 410 outputs the control signal DN so as to allow the VCO 250 to reduce its output frequency (or the VCDL 140 to prolong its clock delay). When the loop is locked and there is no phase difference between the reference frequency (the first frequency signal REF) and the feedback signal (the second frequency signal FBB), one pulse is output for each of the control signals UP and DN to eliminate deadzones in the system. The deadzones are produced when the switches in the charge pump 420 cannot be completely or normally turned on because of the small phase difference and the narrow bandwidth of the control signals UP and DN. Thus, the pulse has to be output in order to allow the DLL 400 or the PLL 500 to operate properly. If the pulse is not output, the DLL 400 or the PLL 500 cannot operate properly with a very small phase difference.

Thus, in the embodiment described above, the switches SW1, SW2, SW3, SW4, and SWR are adopted to resolve the floating node and charge sharing problem in a charge pump circuit. The charge pump 420 is not limited by the bandwidth of a conventional analog circuit and can operate in a high-speed application to greatly increase the operation speed.

Figure 8:
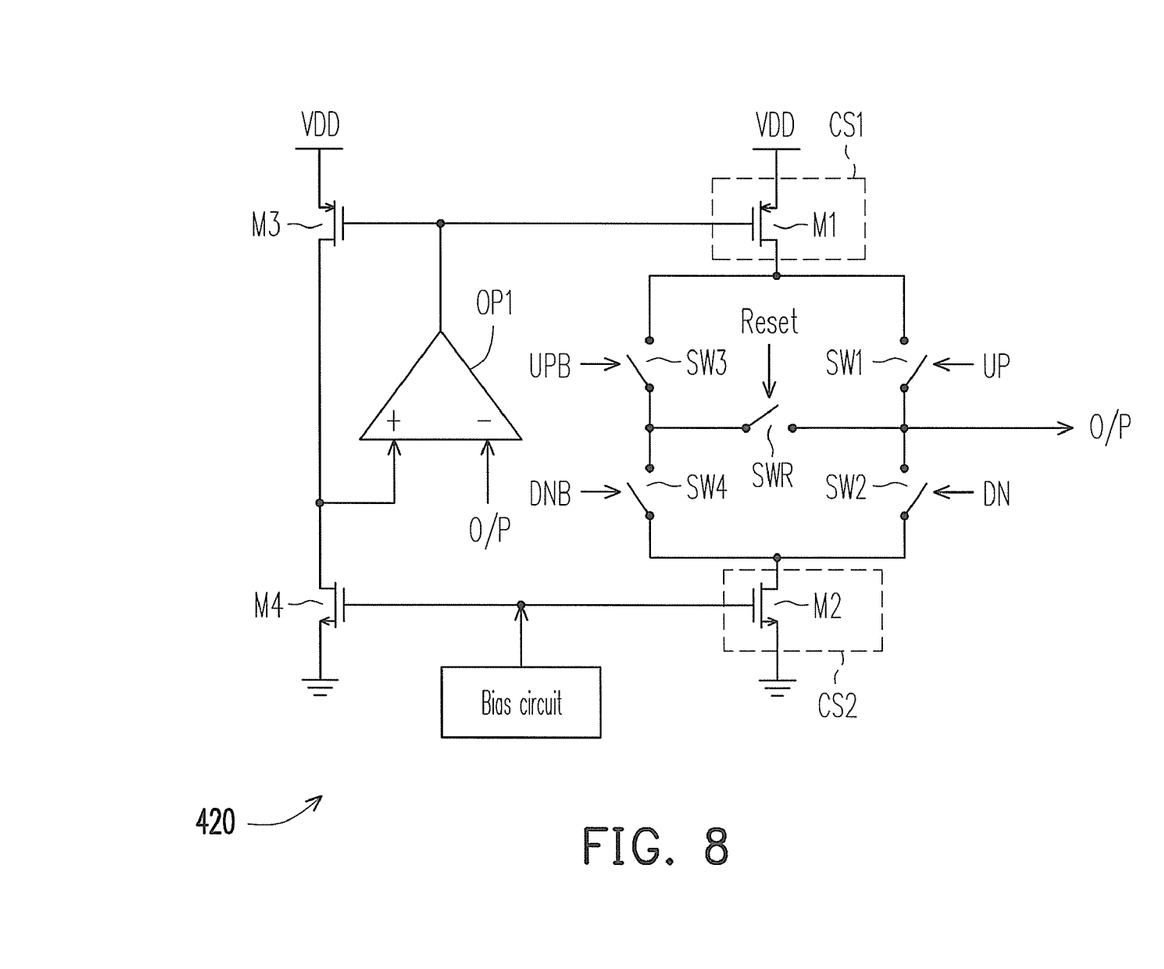
FIG. 8 is a diagram illustrating another implementation of the charge pump 420 in FIG. 4 or FIG. 5 according to the present disclosure.

The charge pump 420 may be implemented differently by those having ordinary knowledge in the art according to the actual design requirement and foregoing descriptions. FIG. 8 is a diagram illustrating another implementation of the charge pump 420 in FIG. 4 or FIG. 5 according to the present disclosure. Referring to FIG. 8, the charge pump 420 includes a first current source CS1, a second current source CS2, a first switch SW1, a second switch SW2, a third switch SW3, a fourth switch SW4, a reset switch SWR, a third transistor M3, a fourth transistor M4, and an operational amplifier OP1. The implementations of the first switch SW1, the second switch SW2, the third switch SW3, the fourth switch SW4, and the reset switch SWR can be referred to the descriptions of foregoing embodiments therefore will not be described herein. In the present embodiment, the first current source CS1 includes a first transistor M1, and the second current source CS2 includes a second transistor M2. The first transistor M1 may be a P-channel metal oxide semiconductor (PMOS) transistor, and the second transistor M2 may be an N-channel metal oxide semiconductor (NMOS) transistor. A first terminal (for example, the source) of the first transistor M1 is coupled to a first voltage (for example, a system voltage VDD), and a second terminal (for example, the drain) of the first transistor M1 is coupled to first terminals of the first switch SW1 and the third switch SW3. A first terminal (for example, the source) of the second transistor M2 is coupled to a second voltage (for example, a ground voltage), and a second terminal (for example, the drain) of the second transistor M2 is coupled to first terminals of the second switch SW2 and the fourth switch SW4.

The third transistor M3 may be a PMOS transistor, and the fourth transistor M4 may be a NMOS transistor. A control terminal (for example, the gate) of the third transistor M3 is coupled to a control terminal (for example, the gate) of the first transistor M1. A first terminal (for example, the source) of the third transistor M3 is coupled to the first voltage, and a second terminal (for example, the drain) of the third transistor M3 is coupled to a second terminal (for example, the drain) of the fourth transistor M4. A first terminal (for example, the source) of the fourth transistor M4 is coupled to the second voltage, and a control terminal (for example, the gate) of the fourth transistor M4 is coupled to a control terminal (for example, the gate) of the second transistor M2. The gates of the fourth transistor M4 and the second transistor M2 are controlled by a bias circuit. The bias circuit provides an appropriate bias, wherein the level of the bias is determined according to the actual design requirement. The implementation of the bias circuit is well known by those having ordinary knowledge in the art therefore will not be described herein. A first input terminal (for example, an inverting input terminal) of the operational amplifier OP1 is coupled to an output terminal of the charge pump 420, and a second input terminal (for example, a non-inverting input terminal) of the operational amplifier OP1 is coupled to the drain of the third transistor M3, and an output terminal of the operational amplifier OP1 is coupled to the gates of the first transistor M1 and the third transistor M3.

Namely, the charge pump 420 illustrated in FIG. 8 is obtained by further producing analog feedback control signals in the charge pump 420 illustrated in FIG. 4 and FIG. 5. Thus, in the charge pump 420 illustrated in FIG. 8, the channel length modulation effect caused by different output voltages (the analog voltage O/P) is reduced.

Figure 9:
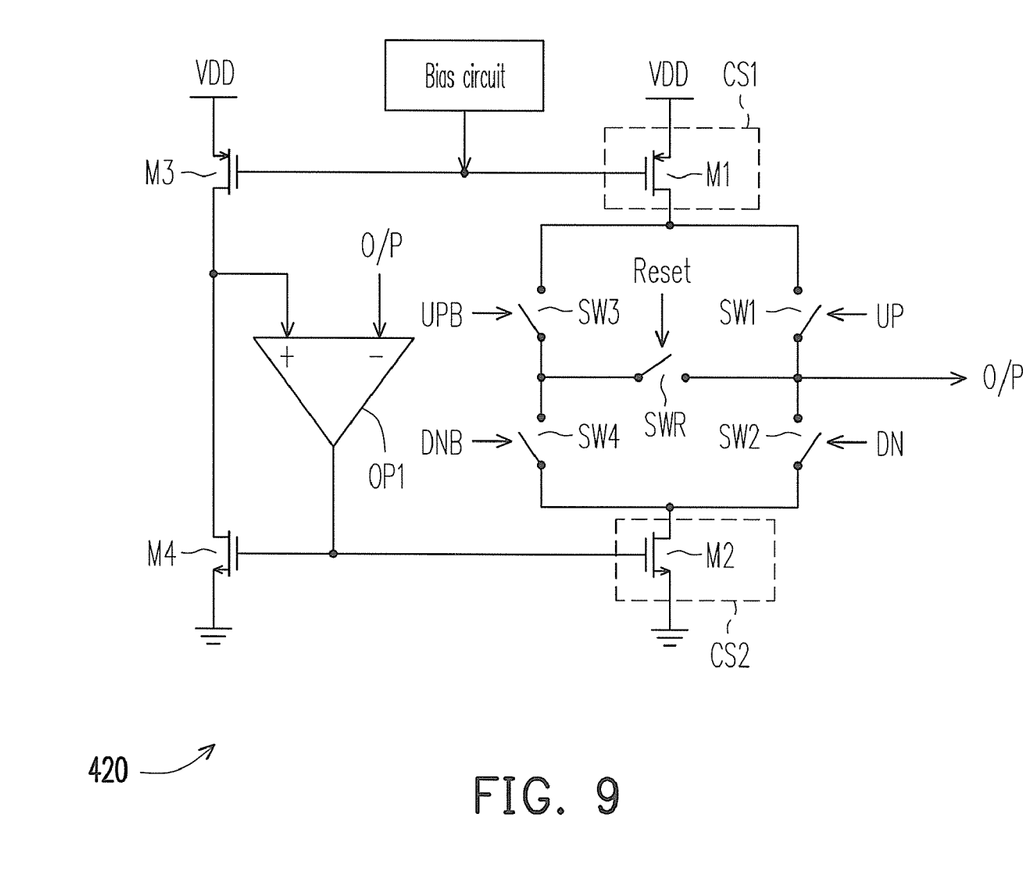
FIG. 9 is a diagram illustrating yet another implementation of the charge pump 420 in FIG. 4 or FIG. 5 according to the present disclosure.

FIG. 9 is a diagram illustrating yet another implementation of the charge pump 420 in FIG. 4 or FIG. 5 according to the present disclosure. The charge pump 420 illustrated in FIG. 9 is similar to that illustrated in FIG. 8, and the difference between the two falls on the operational amplifier OP1. In the charge pump 420 illustrated in FIG. 9, the output terminal of the operational amplifier OP1 is coupled to the gates of the second transistor M2 and the fourth transistor M4, and the gates of the first transistor M1 and the third transistor M3 are controlled by a bias circuit.

Figure 10:
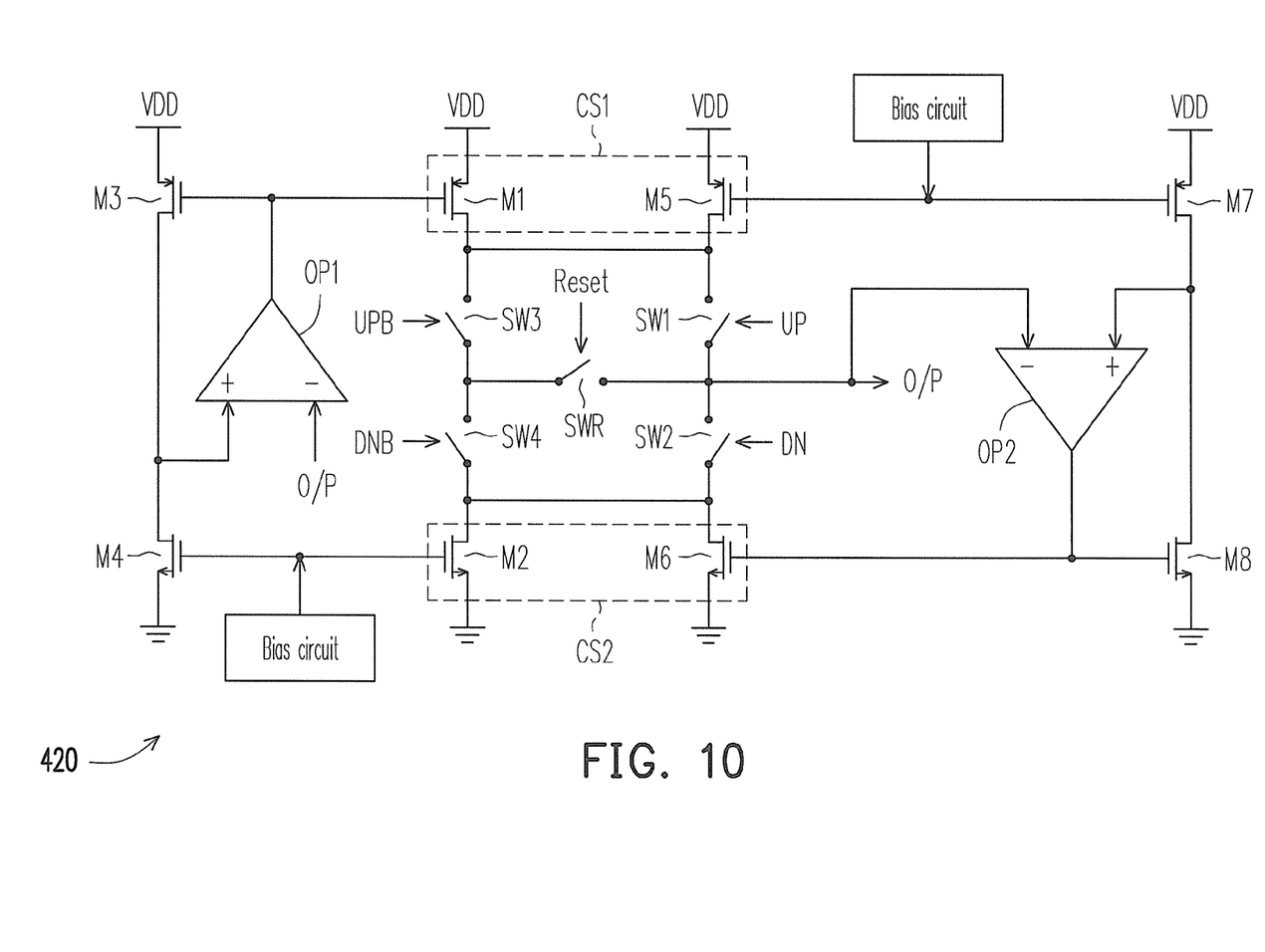
FIG. 10 is a diagram illustrating still another implementation of the charge pump 420 in FIG. 4 or FIG. 5 according to the present disclosure.

FIG. 10 is a diagram illustrating still another implementation of the charge pump 420 in FIG. 4 or FIG. 5 according to the present disclosure. The charge pump 420 illustrated in FIG. 10 is similar to that illustrated in FIG. 8 therefore will not be described herein. In the present embodiment, the first current source CS1 includes a first transistor M1 and a fifth transistor M5, and the second current source CS2 includes a second transistor M2 and a sixth transistor M6. The transistors M1 and M5 may be PMOS transistors, and the transistors M2 and M6 may be NMOS transistors. In addition, the charge pump 420 in FIG. 10 further includes a seventh transistor M7, an eighth transistor M8, and an operational amplifier OP2. The seventh transistor M7 may be a PMOS transistor, and the eighth transistor M8 may be a NMOS transistor.

The sources of the transistors M1 and M5 are coupled to a first voltage (for example, a system voltage VDD), and the drains of the transistors M1 and M5 are coupled to the first terminals of the first switch SW1 and the third switch SW3. The sources of the transistors M2 and M6 are coupled to a second voltage (for example, a ground voltage), and the drains of the transistors M2 and M6 are coupled to the first terminals of the second switch SW2 and the fourth switch SW4. A control terminal (for example, the gate) of the seventh transistor M7 is coupled to a control terminal (for example, the gate) of the fifth transistor M5. The gates of the fifth transistor M5 and the seventh transistor M7 are controlled by a bias circuit. A first terminal (for example, the source) of the seventh transistor M7 is coupled to the first voltage, and a second terminal (for example, the drain) of the seventh transistor M7 is coupled to a second terminal (for example, the drain) of the eighth transistor M8. A first terminal (for example, the source) of the eighth transistor M8 is coupled to the second voltage, and a control terminal (for example, the gate) of the eighth transistor M8 is coupled to a control terminal (for example, the gate) of the sixth transistor M6. A first input terminal (for example, an inverting input terminal) of the operational amplifier OP2 is coupled to the output terminal of the charge pump 420, a second input terminal (for example, the non-inverting input terminal) of the operational amplifier OP2 is coupled to the drain of the seventh transistor M7, and an output terminal of the operational amplifier OP2 is coupled to the gates of the sixth transistor M6 and the eighth transistor M8.

As described above, in embodiments of the present disclosure, the problems of floating node and charge sharing in a charge pump circuit are resolved by using a group of switches. Thus, the charge pump in the present disclosure is not limited by the bandwidth of a conventional analog circuit and can be applied in a high-speed application to greatly improve the operation speed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A charge pump, for providing an output signal according to a first control signal and a second control signal, the charge pump comprising:
   a first current source comprising a first transistor having a first terminal coupled to a first voltage;
   a second current source comprising a second transistor having a first terminal coupled to a second voltage;
   a first switch, having a control terminal for receiving the first control signal, a first terminal coupled to a second terminal of the first transistor, and a second terminal coupled to an output terminal of the charge pump;
   a second switch, having a control terminal for receiving the second control signal, a first terminal coupled to a second terminal of the second transistor, and a second terminal coupled to the output terminal of the charge pump;
   a third switch, having a control terminal for receiving an inverted signal of the first control signal and a first terminal coupled to the second terminal of the first transistor;
   a fourth switch, having a control terminal for receiving an inverted signal of the second control signal, a first terminal coupled to the second terminal of the second transistor, and a second terminal coupled to a second terminal of the third switch;
   a reset switch, having a first terminal coupled to the second terminal of the third switch and a second terminal coupled to the output terminal of the charge pump;
   a third transistor, having a first terminal coupled to the first voltage and a control terminal coupled to a control terminal of the first transistor;
   a fourth transistor, having a first terminal coupled to the second voltage, a second terminal coupled to a second terminal of the third transistor, and a control terminal coupled to a control terminal of the second transistor, wherein the control terminals of the second transistor and the fourth transistor are controlled by a bias circuit; and
   an operational amplifier, having a first input terminal coupled to the output terminal of the charge pump, a second input terminal coupled to the second terminal of the third transistor, and an output terminal coupled to the control terminals of the first transistor and the third transistor.

2. The charge pump according to claim 1, wherein the first switch, the second switch, and the reset switch are turned on during a reset period.

3. A phase-detecting apparatus, comprising:
   a phase detector (PD), for detecting a phase relation between a first frequency signal and a second frequency signal and outputting a first control signal and a second control signal according to the phase relation; and
   a charge pump, comprising:
      a first current source comprising a first transistor having a first terminal coupled to a first voltage;
      a second current source comprising a second transistor having a first terminal coupled to a second voltage;
      a first switch, having a control terminal for receiving the first control signal, a first terminal coupled to a second terminal of the first transistor, and a second terminal coupled to an output terminal of the charge pump;
      a second switch, having a control terminal for receiving the second control signal, a first terminal coupled to a second terminal of the second transistor, and a second terminal coupled to the output terminal of the charge pump;
      a third switch, having a control terminal for receiving an inverted signal of the first control signal and a first terminal coupled to the second terminal of the first transistor;
      a fourth switch, having a control terminal for receiving an inverted signal of the second control signal, a first terminal coupled to the second terminal of the second transistor, and a second terminal coupled to a second terminal of the third switch;
      a reset switch, having a first terminal coupled to the second terminal of the third switch and a second terminal coupled to the output terminal of the charge pump;
      a third transistor, having a first terminal coupled to the first voltage and a control terminal coupled to a control terminal of the first transistor;
      a fourth transistor, having a first terminal coupled to the second voltage, a second terminal coupled to a second terminal of the third transistor, and a control terminal coupled to a control terminal of the second transistor, wherein the control terminals of the second transistor and the fourth transistor are controlled by a bias circuit; and
      an operational amplifier, having a first input terminal coupled to the output terminal of the charge pump, a second input terminal coupled to the second terminal of the third transistor, and an output terminal coupled to the control terminals of the first transistor and the third transistor.

4. The phase-detecting apparatus according to claim 3, wherein the first switch, the second switch, and the reset switch are turned on during a reset period.

5. The phase-detecting apparatus according to claim 3, wherein the PD comprises:
   a first flip-flop, having an input terminal for receiving a first voltage, a trigger terminal for receiving the first frequency signal, and an output terminal for outputting the first control signal;
   a second flip-flop, having an input terminal for receiving the first voltage, a trigger terminal for receiving the second frequency signal, and an output terminal for outputting the second control signal; and
   an AND gate, having a first input terminal and a second input terminal respectively coupled to the output terminals of the first flip-flop and the second flip-flop, and an output terminal for outputting a reset signal to a control terminal of the reset switch and reset terminals of the first flip-flop and the second flip-flop.

6. A phase-locked loop (PLL), comprising:
   a PD, for detecting a phase relation between a first frequency signal and a second frequency signal and outputting a first control signal and a second control signal according to the phase relation;
   a charge pump, comprising:
      a first current source comprising a first transistor having a first terminal coupled to a first voltage;
      a second current source comprising a second transistor having a first terminal coupled to a second voltage;

a first switch, having a control terminal for receiving the first control signal, a first terminal coupled to a second terminal of the first transistor, and a second terminal coupled to an output terminal of the charge pump;

a second switch, having a control terminal for receiving the second control signal, a first terminal coupled to a second terminal of the second transistor, and a second terminal coupled to the output terminal of the charge pump;

a third switch, having a control terminal for receiving an inverted signal of the first control signal and a first terminal coupled to the second terminal of the first transistor;

a fourth switch, having a control terminal for receiving an inverted signal of the second control signal, a first terminal coupled to the second terminal of the second transistor, and a second terminal coupled to a second terminal of the third switch;

a reset switch, having a first terminal coupled to the second terminal of the third switch and a second terminal coupled to the output terminal of the charge pump;

a third transistor, having a first terminal coupled to the first voltage and a control terminal coupled to a control terminal of the first transistor;

a fourth transistor, having a first terminal coupled to the second voltage, a second terminal coupled to a second terminal of the third transistor, and a control terminal coupled to a control terminal of the second transistor, wherein the control terminals of the second transistor and the fourth transistor are controlled by a bias circuit; and an operational amplifier, having a first input terminal coupled to the output terminal of the charge pump, a second input terminal coupled to the second terminal of the third transistor, and an output terminal coupled to the control terminals of the first transistor and the third transistor;

a filter, having an input terminal coupled to the output terminal of the charge pump;

a voltage-controlled oscillator (VCO), having an input terminal coupled to an output terminal of the filter; and a frequency divider, having an input terminal coupled to an output terminal of the VCO and an output terminal for providing the second frequency signal to the PD.

7. The PLL according to claim 6, wherein the first switch, the second switch, and the reset switch are turned on during a reset period.

8. The PLL according to claim 6, wherein the PD comprises:

a first flip-flop, having an input terminal for receiving a first voltage, a trigger terminal for receiving the first frequency signal, and an output terminal for outputting the first control signal;

a second flip-flop, having an input terminal for receiving the first voltage, a trigger terminal for receiving the second frequency signal, and an output terminal for outputting the second control signal; and an AND gate, having a first input terminal and a second input terminal respectively coupled to the output terminals of the first flip-flop and the second flip-flop, and an output terminal for outputting a reset signal to a control terminal of the reset switch and reset terminals of the first flip-flop and the second flip-flop.

9. The PLL according to claim 6, wherein the filter comprises:

a resistor, having a first terminal coupled to the output terminal of the charge pump and the input terminal of the VCO; and a capacitor, having a first terminal coupled to a second terminal of the resistor and a second terminal coupled to a reference voltage.

10. A charge pump, for providing an output signal according to a first control signal and a second control signal, the charge pump comprising:

a first current source comprising a first transistor having a first terminal coupled to a first voltage;

a second current source comprising a second transistor having a first terminal coupled to a second voltage;

a first switch, having a control terminal for receiving the first control signal, a first terminal coupled to a second terminal of the first transistor, and a second terminal coupled to an output terminal of the charge pump;

a second switch, having a control terminal for receiving the second control signal, a first terminal coupled to a second terminal of the second transistor, and a second terminal coupled to the output terminal of the charge pump;

a third switch, having a control terminal for receiving an inverted signal of the first control signal and a first terminal coupled to the second terminal of the first transistor;

a fourth switch, having a control terminal for receiving an inverted signal of the second control signal, a first terminal coupled to the second terminal of the second transistor, and a second terminal coupled to a second terminal of the third switch;

a reset switch, having a first terminal coupled to the second terminal of the third switch and a second terminal coupled to the output terminal of the charge pump;

a third transistor, having a first terminal coupled to the first voltage and a control terminal coupled to a control terminal of the first transistor, wherein the control terminals of the first transistor and the third transistor are controlled by a bias circuit;

a fourth transistor, having a first terminal coupled to the second voltage, a second terminal coupled to a second terminal of the third transistor, and a control terminal coupled to a control terminal of the second transistor; and an operational amplifier, having a first input terminal coupled to the output terminal of the charge pump, a second input terminal coupled to the second terminal of the third transistor, and an output terminal coupled to the control terminals of the second transistor and the fourth transistor.

11. A phase-detecting apparatus, comprising:

a phase detector (PD), for detecting a phase relation between a first frequency signal and a second frequency signal and outputting a first control signal and a second control signal according to the phase relation; and a charge pump, comprising:

a first current source comprising a first transistor having a first terminal coupled to a first voltage;

a second current source comprising a second transistor having a first terminal coupled to a second voltage;

a first switch, having a control terminal for receiving the first control signal, a first terminal coupled to a second terminal of the first transistor, and a second terminal coupled to an output terminal of the charge pump;

a second switch, having a control terminal for receiving the second control signal, a first terminal coupled to a second terminal of the second transistor, and a second terminal coupled to the output terminal of the charge pump;

a third switch, having a control terminal for receiving an inverted signal of the first control signal and a first terminal coupled to the second terminal of the first transistor;

a fourth switch, having a control terminal for receiving an inverted signal of the second control signal, a first terminal coupled to the second terminal of the second transistor, and a second terminal coupled to a second terminal of the third switch;

a reset switch, having a first terminal coupled to the second terminal of the third switch and a second terminal coupled to the output terminal of the charge pump;

a third transistor, having a first terminal coupled to the first voltage and a control terminal coupled to a control terminal of the first transistor, wherein the control terminals of the first transistor and the third transistor are controlled by a bias circuit;

a fourth transistor, having a first terminal coupled to the second voltage, a second terminal coupled to a second terminal of the third transistor, and a control terminal coupled to a control terminal of the second transistor; and an operational amplifier, having a first input terminal coupled to the output terminal of the charge pump, a second input terminal coupled to the second terminal of the third transistor, and an output terminal coupled to the control terminals of the second transistor and the fourth transistor.

12. A phase-locked loop (PLL), comprising:

a PD, for detecting a phase relation between a first frequency signal and a second frequency signal and outputting a first control signal and a second control signal according to the phase relation;

a charge pump, comprising:

a first current source comprising a first transistor having a first terminal coupled to a first voltage;

a second current source comprising a second transistor having a first terminal coupled to a second voltage;

a first switch, having a control terminal for receiving the first control signal, a first terminal coupled to a second terminal of the first transistor, and a second terminal coupled to an output terminal of the charge pump;

a second switch, having a control terminal for receiving the second control signal, a first terminal coupled to a second terminal of the second transistor, and a second terminal coupled to the output terminal of the charge pump;

a third switch, having a control terminal for receiving an inverted signal of the first control signal and a first terminal coupled to the second terminal of the first transistor;

a fourth switch, having a control terminal for receiving an inverted signal of the second control signal, a first terminal coupled to the second terminal of the second transistor, and a second terminal coupled to a second terminal of the third switch;

a reset switch, having a first terminal coupled to the second terminal of the third switch and a second terminal coupled to the output terminal of the charge pump;

a third transistor, having a first terminal coupled to the first voltage and a control terminal coupled to a control terminal of the first transistor, wherein the control terminals of the first transistor and the third transistor are controlled by a bias circuit;

a fourth transistor, having a first terminal coupled to the second voltage, a second terminal coupled to a second terminal of the third transistor, and a control terminal coupled to a control terminal of the second transistor; and an operational amplifier, having a first input terminal coupled to the output terminal of the charge pump, a second input terminal coupled to the second terminal of the third transistor, and an output terminal coupled to the control terminals of the second transistor and the fourth transistor;

a filter, having an input terminal coupled to the output terminal of the charge pump;

a voltage-controlled oscillator (VCO), having an input terminal coupled to an output terminal of the filter; and a frequency divider, having an input terminal coupled to an output terminal of the VCO and an output terminal for providing the second frequency signal to the PD.

* * * * *